United States Patent [19]

Niwa

[11] 4,138,781
[45] Feb. 13, 1979

[54] METHOD FOR MANUFACTURING SEMICONDUCTOR DEVICE

[75] Inventor: Kazuo Niwa, Yokohama, Japan

[73] Assignee: Tokyo Shibaura Electric Co., Ltd., Kawasaki, Japan

[21] Appl. No.: 757,572

[22] Filed: Jan. 7, 1977

[30] Foreign Application Priority Data

Jan. 10, 1976 [JP] Japan ................... 51-2354

[51] Int. Cl.² ............................................. B01J 17/00
[52] U.S. Cl. ..................................................... 29/571
[58] Field of Search ......................................... 29/571

[56] References Cited

U.S. PATENT DOCUMENTS

| | | | |
|---|---|---|---|
| 3,700,507 | 10/1972 | Murray | 29/571 |
| 3,707,656 | 12/1972 | DeWitt | 29/571 |
| 3,708,360 | 1/1973 | Wakefield et al. | 29/571 |
| 3,798,752 | 3/1974 | Fujimoto | 29/571 |
| 3,800,411 | 4/1974 | Abbink | 29/571 |
| 3,967,981 | 7/1976 | Yamazaki | 29/571 |

*Primary Examiner*—Gerald A. Dost
*Attorney, Agent, or Firm*—Finnegan, Henderson, Farabow & Garrett

[57] ABSTRACT

In a method for the manufacture of a semiconductor device, comprising selectively forming at least one function region of a semiconductor element by a photoengraving technique using a masking layer and forming an electrode metal layer on an electrode contact surface portion of said substrate adjacent to the function region, the position of the electrode contact portion is determined by subjecting the masking layer on the surface of the substrate to an initial patterning step. This method can be advantageously used to attain high integration of an IC device.

8 Claims, 4 Drawing Figures

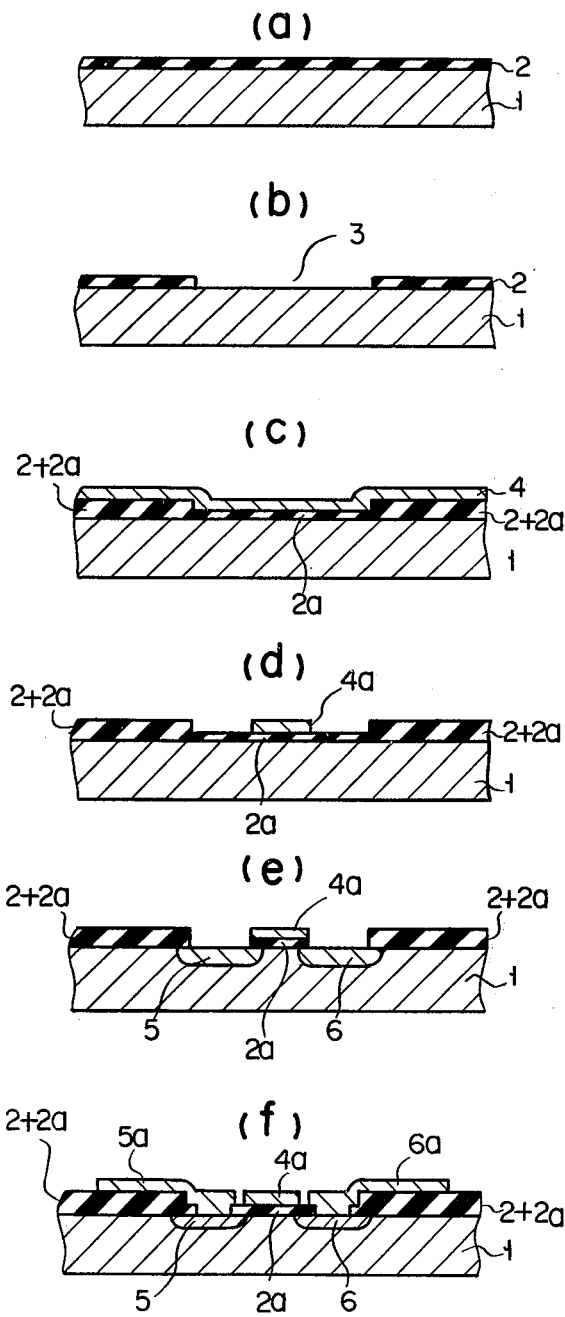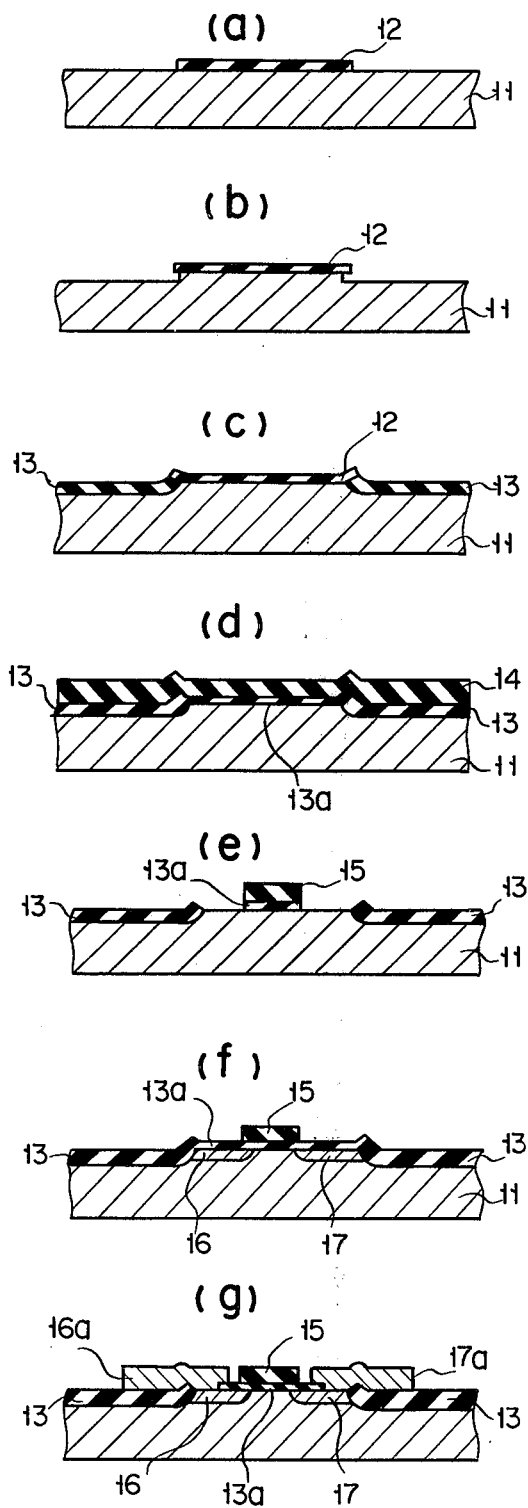

FIG. 3
(a)
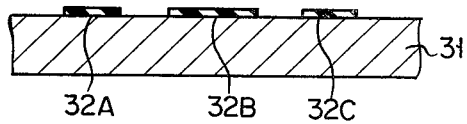
(b)
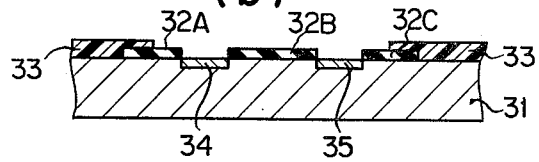
(c)
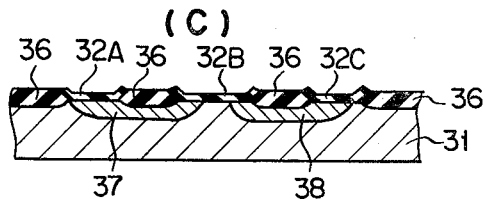
(d)
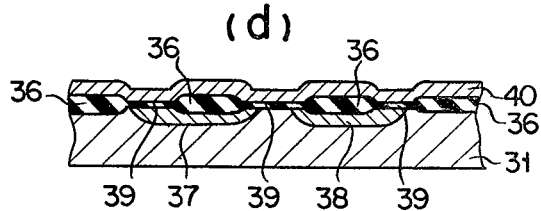
(e)
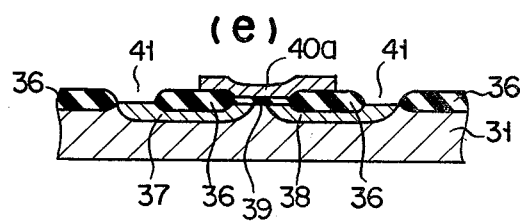
(f)
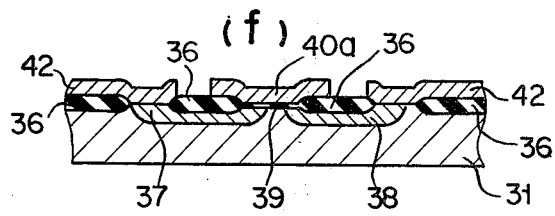
FIG. 4
(a)
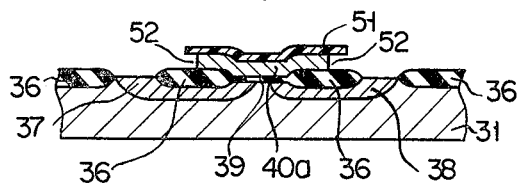
(b)
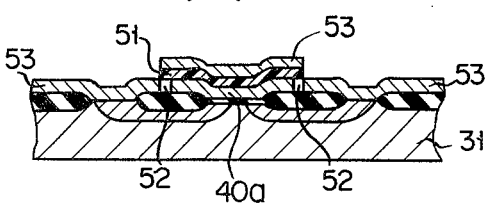
(c)
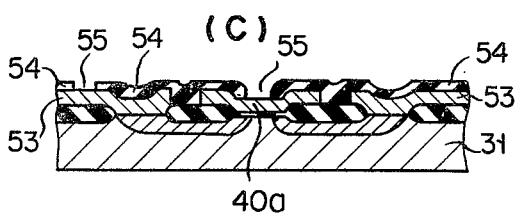
(d)
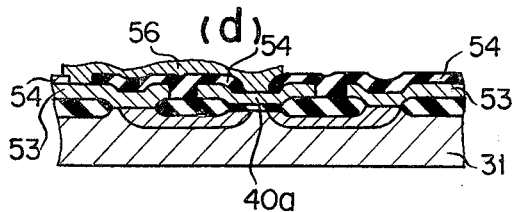

METHOD FOR MANUFACTURING SEMICONDUCTOR DEVICE

BACKGROUND OF THE INVENTION

This invention relates to a method for manufacturing semiconductor device and in particular an integrated circuit (IC) device.

A MOS type integrated circuit (hereinafter referred to as MOS IC) of semiconductor devices is greatly required to enhance the degree of integration from the standpoint of price reduction as well as compactness. However, a limitation on the enhanced integration is encountered during a photoengraving step (a technique for selectively removing a masking layer or a metal layer on a substrate surface hereinafter referred to as a PE technique —) in the manufacture of semiconductor devices. A selfalign gate (SAG) process is known as being capable of omitting one PE step. FIGS. 1(a) to 1(f) are cross-sectional views schematically showing the sequence of a SAG step. A $SiO_2$ film 2 is formed on the surface of a silicon substrate 1 as shown in FIG. 1(a) and the $SiO_2$ film 2 is selectively removed by the PE technique to leave an opening 3 as shown in FIG. 1(b). After a $SiO_2$ film 2a for a gate oxide film is covered on the resultant substrate, a polysilicon layer 4 is covered on the $SiO_2$ film 2 and 2a as shown in FIG. 1(c). The polysilicon layer is selectively removed to leave a gate electrode 4a as shown in FIG. 1(d). After removing those portions of the $SiO_2$ layer which correspond to source and drain regions to be formed, an impurity is introduced into the substrate to form source and drain regions 5 and 6 as shown in FIG. 1(e). A thin $SiO_2$ film (not shown) formed on the exposed surfaces of the source and drain regions are removed by the PE technique so as to form electrode contact portions and after coating a metal film on the resultant semiconductor structure, the surface of the semiconductor structure is subjected to patterning to form source and drain electrodes 5a and 6a as shown in FIG. 1(f). As a result, a MOS IC device is manufactured. Since, however, the height of the uneven, superposed layer on the substrate is great as compared with the length of the electrode contact portion as shown in FIG. 1(f), it is difficult to form a fine pattern at the electrode contact portion. That is, the PE step used in the formation of the electrode contact portion often determines the size of semiconductor elements, since it requires a most fine patterning in comparison with the other PE steps. The depth of the uneven, superposed layer on the substrate is usually of the order of about 1μ as measured from the substrate as shown in FIG. 1(e) and the length of the electrode contact portion is industrially limited to about 4 to 5μ.

Since the uneven surface of the semiconductor structure provides a bar to the formation of a subsequent connection metal layer, a LOCOS (local oxide of silicon) process is applied to make the surface of a semiconductor structure even smoother. The LOCOS process will now be explained below by refering to FIGS. 2(a) to (g). A $Si_3N_4$ film 12 is coated on the surface portion of a silicon substrate 11 as shown in FIG. 2(a) and the surface of the resultant substrate is chemically etched with the $Si_3N_4$ film 12 as a mask as shown in FIG. 2(b) (this is a PE step). The substrate is thermally oxidized to form a $SiO_2$ film 13 on the exposed surface of the substrate as shown in FIG. 2(c). The $Si_3N_4$ film 12 is replaced by a $SiO_2$ film (part of the $SiO_2$ film afterward constitutes a gate oxide film) 13a and a doped polysilicon film 14 is covered on the resultant $SiO_2$ film 13 and 13a as shown in FIG. 2(d). The polysilicon film 14 is selectively removed by a photoengraving method to form a polysilicon area 15 for a gate as shown in FIG. 2(e). After the $SiO_2$ film 13a is selectively removed from the substrate surface, source and drain regions 16 and 17 are formed by a diffusion method in the surface areas of the substrate as shown in FIG. 2(f) and a contact hole for electrodes is provided by the PE method. A metal layer for electrodes is formed on the resultant semiconductor structure and, after the metal layer is selectively removed, source and drain electrodes 16a and 17a are formed as shown in FIG. 2(g). Although this LOCOS method permits formation of a relatively flat metal connection layer for electrodes as compared with the SAG process as shown in FIG. 1 it is difficult to form a tiny hole, since the poly-Si layer 15 is stepped in configuration.

SUMMARY OF THE INVENTION

One object of this invention is to provide a method for manufacturing a semiconductor device, which permits a masking layer and metal layer to be readily formed at a fine pattern during the manufacturing process of the semiconductor device.

Another object of this invention is to provide a method for manufacturing a semiconductor device, which permits an electrode contact portion of small opening to be formed readily and accurately.

Another object of this invention is to provide a method for manufacturing a highly integrated circuit device.

Another object of this invention is to provide a method for manufacturing a semiconductor device which involves less short-circuiting and less leakage.

The other objects and further advantages will be attained by the invention as will be later described. One aspect of this invention is as follows:

In a method for manufacturing a semiconductor device comprising selectively forming at least one function region of a semiconductor element in a position adjacent to one surface of a semiconductor substrate using a masking layer and forming an electrode metal layer on an electrode contact surface portion of said substrate adjacent to the function region, the improvement in which the position of the electrode contact portion is determined by subjecting the masking layer on the surface of the substrate to an initial patterning step (i.e. selectively forming the first masking layer in a predetermined pattern on the surface of the semiconductor substrate).

According to another aspect of this invention, there is provided a method for manufacturing a semiconductor device comprising the steps of (a) selectively forming a first masking layer on a surface of a silicon substrate to provide those substrate portions in contact with the masking layer which respectively constitute electrode contact portions for a source and drain of a MOS transistor and a channel region of the MOS transistor;

(b) selectively forming a second masking layer on the exposed surface portions of the substrate in a manner that openings for source and drain regions are left uncovered;

(c) forming source and drain regions in the substrate by introducing an impurity through said openings into the substrate using the first and second masking layers;

(d) forming a third masking layer on the exposed surfaces of the substrate after removing the second masking layer;

(e) after removal of the first masking layer, forming an insulating layer in a position where the first masking layer is removed, said insulating layer being thinner than said third masking layer;

(f) forming a polycrystalline silicon layer (poly-Si layer) on said third masking layer and said insulating layer;

(g) selectively removing said poly-Si layer by a photograving method using a photoresist as a mask, to form a poly-Si gate electrode;

(h) subjecting the surface of the resultant semiconductor structure to photoengraving with said photoresist left on said gate electrode, thereby removing that insulating layer which is not covered with said gate electrode, the substrate surface portions exposed by this step (h) constituting said electrode contact portions; and (i) forming a metal layer on said electrode contact portions formed by the step (h).

In another aspect of this invention there is provided a method in which an excess photoengraving is effected at the step (g) to permit the side portion of the gate electrode below the photoresist mask to be removed; a metal layer for electrodes is formed; after the step (h) is effected, on the electrode contact portions and on the remaining surface of the semiconductor structure with the photoresist mask left on the gate electrode; and the photoresist mask is removed together with the metal layer on the photoresist mask so that source and drain electrodes are formed sufficiently close to the gate electrode.

BRIEF DESCRIPTION OF THE DRAWING

FIGS. 1(a) to 1(f) show a conventional method for the manufacture of a semiconductor device;

FIGS. 2(a) to 2(g) show another conventional method for the manufacture of a semiconductor device;

FIGS. 3(a) to 3(f) show a method for the manufacture of a semiconductor device which is according to this invention; and FIGS. 4(a) to 4(d) show another method for the manufacture of a semiconductor device which is according to this invention.

DESCRIPTION OF THE PREFERRED EMBODIMENT

One example of this invention will now be described below by referring to the accompanying drawings.

In FIG. 3 a P-type silicon substrate 31 is so formed as to have a very flat surface and a $SiO_2$ film, not shown, having a thickness of about 500Å is formed on the surface of the substrate 31. A $Si_3N_4$ film is formed by a CVD (chemical vapor deposition) method on the $SiO_2$ film. The $Si_3N_4$ film is selectively removed by the PE technique to form first masking layers 32A, 32B, 32C in a predetermined pattern as shown in FIG. 3(a). The PE technique is applied with a 1μ accuracy using a $CF_4$ (freon) plasma. The formation of the $SiO_2$ film as a ground layer is effected to prevent cracks which might occur when the $Si_3N_4$ film is coated directly on the silicon substrate 31. Since the above-mentioned patterning is applied to the flat surface of the semiconductor structure it is very easy to attain an accuracy of the order of about 1μ. At a later step, electrode contact portions are formed on those substrate surfaces adjacent to the masking layers 32A and 32C and a channel region is formed in that surface portion of the substrate which is contacted with the masking layer 32B.

As a second mask layer a photoresist layer 33 is formed on the surface of the semiconductor structure and an N type impurity, $Sb$, is injected by an ion implantation method into the exposed surfaces of the substrate with both the resist layer 33 and $Si_3N_4$ layer as a mask to form regions 34 and 35 as shown in FIG. 3(b). Since the photoresist layer 33 needs only to cover those exposed surfaces of the substrate which are situated outside the masking layers 32A and 32C, it can be readily formed with a greater latitude.

After removal of the second mask layer 33 the surface of the resultant structure is selectively subjected to thermal oxidation with the first masking layer as a mask, to form a third masking layer 36 in thickness of about 1μ which is made of $SiO_2$. At this time, $Sb$ in the regions 34 and 35 is thermally diffused to form source and drain regions 37 and 38 as shown in FIG. 3(c).

Since the formation of the $SiO_2$ layer 36 involves an increase in its volume the $Si_3N_4$ layers 32A, 32B and 32C are raised, as shown in FIG. 3(c), at their edge which is in contact with the $SiO_2$ layer 36. The $Si_3N_4$ layers 32A, 32B and 32C are removed by $CF_4$ plasma etching and after an insulating layer ($SiO_2$ layer) 39 is formed in thickness of about 800Å on the exposed surface of the substrate, a polysilicon layer 40 for a gate is formed on the surface of the resultant structure. The polysilicon layer 40 is formed by a CVD method in thickness of about 3000Å by thermally decomposing $SiH_4$. It is preferred to lower the specific resistivity of the polysilicon layer by simultaneously applying $AsH_3$ or $PH_3$ so as to be doped into the poly-Si layer 40 as shown in FIG. 3(d).

An unnecessary portion of the poly-Si layer 40 is removed, by a photoengraving method using a photoresist as a mask, to form a gate electrode 40a made of poly-Si. With the photoresist layer (not shown) left on the gate electrode 40a the insulating layer 39 on the electrode contact portion is removed by photoengraving with the photoresist layer (not shown) left on the gate electrode 40a, leaving an opening 41 (i.e., exposing the electrode contact portion) as shown in FIG. 3(e). This step can be easily effected for the reasons as set out below. That is, since the insulating layer 39 is thinner than the third masking layer 36, if use is made of an etching solution by which both the layers 39 and 36 can be dissolved, the insulating layer 39 on the electrode contact area can be readily removed by chemical etching. In this case, the surface of the third masking layer 36 is somewhat etched, but no inconvenience is involved due to a sufficient thickness of the masking layer 36. After the formation of the gate electrode 40a or the opening 41 a $SiO_2$ layer can be selectively formed on the surface of the gate electrode 40a to form a hole through which an electrical contact is made with the gate electrode. After the electrode contact portion is formed on the surface of the substrate, phosphorous (P) can be diffused at that place so as to provide a good ohmic contact. Finally, an Al connection layer 42 is formed for each electrode. That is, an Al connection layer 42 is formed by a vacuum evaporation on the surface of the resultant semiconductor structure, followed by patterning. In this way, a MOS IC is formed as shown in FIG. 3(f). In the same method, it is possible to form an enhancement/depletion type MOS transistor and complementary MOS transistor, but one more PE step and ion implantation step or a diffusion step is necessary in this case.

In order to provide a high integration to the IC device a space between the poly-Si gate electrode 40a and the A1 connection layer 42 is preferably made as close to each other as possible to the extent that they are not short-circuited. An effective method for attaining such an object will now be explained below by referring to FIGS. 4(a) to 4(d).

FIG. 4(a) shows the same semiconductor structure as in FIG. 3(e), except that a photoresist layer 51 is formed on the poly-Si gate electrode 40a. In FIG. 4 the same reference numerals are employed to designate elements corresponding to those shown in FIG. 3. With the photoresist layer 51 as a mask the poly-Si layer 40 is selectively removed by photoengraving, preferably a chemical etching method using an etching solution. The side of the gate electrode 40a is recessed by subjecting it to an excessive chemical etching, i.e., by permitting it to be contacted for a long time with the etching solution and a recess 52 is thus formed around the side of the gate electrode 40a with the photoresist layer 51 jutting out as shown in FIG. 4(a), while at the same time electrode contact portions are exposed to the surface of the substrate. With the photoresist mask 51 left on the gate electrode 40a, a metal layer 53 is so formed as to make electrical connection with the electrode contact portion as shown in FIG. 4(b). When the photoresist mask 51 is removed, the metal layer on the photoresist mask 51 is also removed (not shown). If an electrical connection is to be made with the gate electrode 40a and source electrode, a SiO₂ insulating layer 54 is selectively formed to provide holes 55,55 as shown in FIG. 4(c) and a metal layer 56 is formed to make a separate electrical connection with the holes 55,55 as shown in FIG. 4(d). In this way, a MOS type IC device is completed.

According to this invention the position of the electrode contact portions which requires a most accurate patterning step can be determined by subjecting a masking layer on the surface of the substrate to a first patterning step. This permits the degree of integration of an integrated circuit to be enhanced as compared with the conventional method in which such a patterning step is effected at a later step. Furthermore, it is possible to prevent leakage as well as an undesirable shortening between the electrode metal layers.

Although in the above-mentioned example the MOS transistor is formed, this invention can also be applied to the formation of a bipolar type transistor.

What is claimed is:

1. In a method for manufacturing a semiconductor device comprising selectively forming at least one function region of a semiconductor element in a position adjacent to one surface of a semiconductor substrate using a masking layer and forming an electrode metal layer on an electrode contact surface portion of said substrate adjacent to the function region, the improvement in which the position and size of the electrode contact portion is predetermined by subjecting the masking layer formed on the surface of the substrate to an initial patterning step to form at least one masking island, wherein the surface portion of the substrate contacting the masking island constitutes the electrode contact portion.

2. A method for manufacturing a semiconductor device comprising the steps of
(a) selectively forming a first masking layer on a surface of a silicon substrate, to provide those substrate portions in contact with the masking layer which respectively constitute electrode contact portions for a source and drain of a MOS transistor and a channel region of the MOS transistor;
(b) selectively forming a second masking layer on the exposed surface portions of the substrate in a manner that openings for source and drain regions are left uncovered;
(c) forming source and drain regions in the substrate by introducing an impurity through said openings into the substrate using the first and second masking layers;
(d) forming a third masking layer on the exposed surfaces of the substrate after removing the second masking layer;
(e) after removal of the first masking layer, forming an insulating layer in a position where the first masking layer is removed, said insulating layer being thinner than said third masking layer;
(f) forming a polycrystalline silicon layer on said third masking layer and said insulating layer;
(g) selectively removing said polycrystalline silicon layer by a photoengraving method using a photoresist as a mask, to form a polycrystalline silicon electrode;
(h) subjecting the surface of the resultant semiconductor structure to photoengraving with said photoresist left on said gate electrode, thereby removing that insulating layer which is not covered with said gate electrode, the substrate surface portions exposed by this step (h) constituting said electrode contact portions; and
(i) forming a metal layer on said electrode contact portions formed by the step (h).

3. A method according to claim 2, in which an excess photoengraving is effected at the step (g) to permit the side portion of the gate electrode between the photoresist mask to be removed; a metal layer for electrodes is formed, after the step (h) is effected, on the electrode contact portions and on the remaining surface of the semiconductor structure with the photoresist mask left on the gate electrode; and the photoresist mask is removed together with the metal layer on the photoresist mask so that source and drain electrodes are formed sufficiently close to the gate electrode.

4. A method according to claim 2, in which said first masking layer is made of $Si_3N_4$.

5. A method according to claim 2, in which said second masking layer is made of a photoresist layer.

6. A method according to claim 2, in which said third masking layer is formed by subjecting the exposed surface of the substrate to thermal oxidation using the first masking layer as a mask.

7. A method according to claim 2, in which said insulating layer is made of $SiO_2$.

8. A method for manufacturing a semiconductor device comprising the steps of:
(a) selectively forming on the surface of a substrate of one conductivity type at least one masking island of predetermined position and size;
(b) forming in the substrate at least one region of conductivity type opposite to the substrate, wherein a part of the at least one masking island is overlappingly formed on the at least one region of opposite conductivity type;
(c) removing the at least one masking island;
(d) exposing the substrate surface portion substantially of the predetermined position and size of the at least one masking island to constitute an electrode contact portion; and
(e) forming an electrode metal layer on the electrode contact portion.

* * * * *